United States Patent [19]
Wine

[11] Patent Number: 4,595,910
[45] Date of Patent: Jun. 17, 1986

[54] DIGITAL-TO-ANALOG CONVERTER USEFUL IN A TELEVISION RECEIVER

[75] Inventor: Charles M. Wine, Princeton, N.J.

[73] Assignee: RCA Corporation, Princeton, N.J.

[21] Appl. No.: 518,146

[22] Filed: Jul. 28, 1983

[51] Int. Cl.⁴ .......................................... H03K 13/02
[52] U.S. Cl. .............................. 340/347 DA; 334/11
[58] Field of Search .................. 340/347 DA, 347 M; 334/11, 14, 15; 455/182, 185

[56] References Cited

U.S. PATENT DOCUMENTS

| | | | |
|---|---|---|---|
| 4,016,555 | 4/1977 | Tyrrel | 340/347 |
| 4,085,372 | 4/1978 | Mogi et al. | 340/347 DA |
| 4,209,775 | 6/1980 | Kawashima et al. | 340/347 |
| 4,258,355 | 3/1981 | Edwards | 340/347 |
| 4,292,625 | 9/1981 | Schoeff | 340/347 |
| 4,415,882 | 11/1983 | Akazawa et al. | 340/347 |
| 4,450,518 | 5/1984 | Klee | 340/347 DA |
| 4,484,178 | 11/1984 | Lovgren et al. | 340/347 |

FOREIGN PATENT DOCUMENTS 1492263 11/1977 United Kingdom .
2086161 5/1982 United Kingdom .

OTHER PUBLICATIONS

"Digital Television Tuner Uses MOS LSI and Nonvolatile Memory" from Electronics, Apr. 1, 1976.
"An Electronic Tuning System for TV Receivers Utilizing a Non-Volatile NMOS Memory", 1976 IEEE International Solid-State Circuits Conference.

Primary Examiner—Clifford C. Shaw
Attorney, Agent, or Firm—Eugene M. Whitacre; Peter M. Emanuel; Lawrence C. Edelman

[57] ABSTRACT

A digital-to-analog converter suitable for use in a television tuning system for converting bits of a digital word to a corresponding tuning voltage includes a first digital-to-duty factor converter responsive to a group of the most significant bits of the digital word for generating a first incrementally variable duty factor pulse signal and a second digital-to-duty factor converter responsive to a group of the next most significant bits of the digital word for generating a second incrementally variable duty factor pulse signal. The amplitude of the first and second pulse signals are differentially weighted, e.g., by standard tolerance resistors (±10%), such that the maximum average DC potential of the second signal is greater than a single increment of the average DC potential of the first signal. The weighted signals are combined and filtered by a lowpass filter which derives the tuning voltage. This deliberately results in non-monotonicity but without a significant reduction in resolution.

15 Claims, 5 Drawing Figures

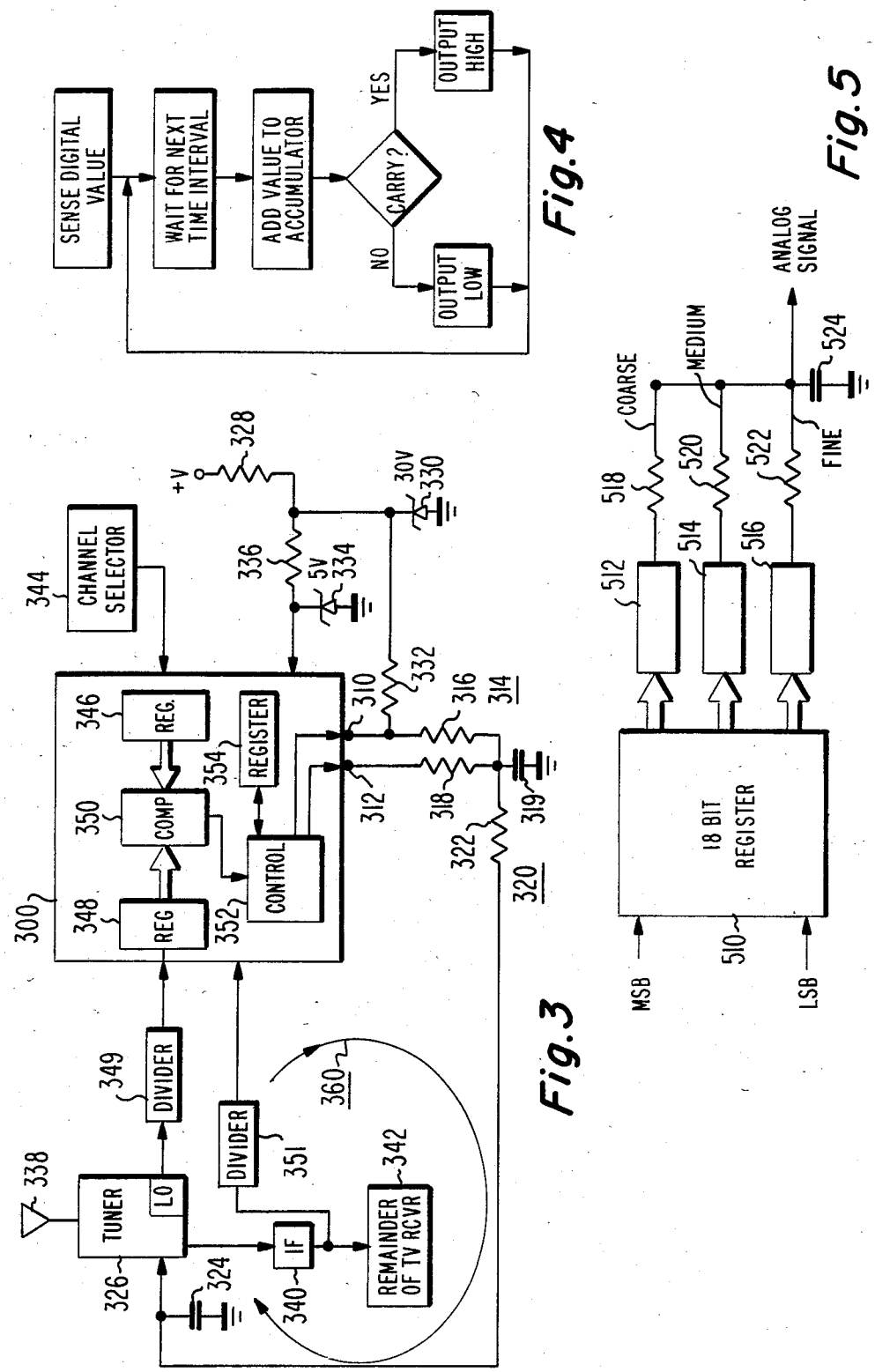

DIGITAL-TO-ANALOG CONVERTER USEFUL IN A TELEVISION RECEIVER

The present invention relates to a digital-to-analog converter (DAC) and more particularly to a low cost but high resolution DAC particularly useful in a radio or television (TV) receiver.

DACs convert digital words to corresponding analog signals and are consequently widely used. For example, in a tuning system for a radio or TV receiver, a DAC may be used to convert a digital word generated in response to a channel selection, to a tuning voltage for application to voltage controlled frequency selective devices, such as varactor diodes, in the tuner.

Tuning systems often include a DAC of the type including a pulse width modulator or a binary rate multiplier for generating an incrementally variable duty factor pulse signal which is lowpass filtered for deriving the analog tuning voltage. The binary rate multiplier type of DAC is responsive to the digital word for generating a pulse signal having uniformly short duration pulses proportional in number in a conversion cycle to the magnitude of the analog tuning signal. The pulse width modulator type of DAC generates a single pulse signal in a conversion cycle having a duration proportional to the magnitude of the analog tuning voltage.

Since the resolution required for a TV tuning system is generally one part in 16,000 ($2^{14}$), the pulse signal from a binary rate multiplier type of DAC will have a large number of rising and falling transitions and the pulse signal from the pulse width modulator will have only two transitions. The pulse signal from the pulse width modulator type of DAC requires a lowpass filter having a relatively large value filter capacitor which results in a relatively slow response time for the DAC. Although the filter requirements of a binary rate multiplier type of DAC are eased, the relatively large number of transitions of the pulse signal degrade the operation of the DAC over temperature variations.

Some prior art tuners employ DACs of the type which generate two pulse signals in parallel, one representative of a coarse tuning voltage (i.e., a group of the most significant bits of the digital word) and the other representative of a fine tuning voltage (i.e., the remaining, least significant bits of the digital word). This results in fewer pulse transitions when the binary rate multiplier type DAC is used and allows the use of slower speed processing circuitry. This should reduce the cost of the DAC. However, precision switching circuitry is required in order to precisely proportion the contribution of the fine pulse signals to fit the coarse pulse signals in order that the combination of the coarse and fine pulse signals results in a uniformly monotonic analog voltage output. As used herein, uniformly monotonic refers to a continuous function wherein the output changes in equal amounts for each 1-bit change of the digital input word. This extra circuitry tends to increase the complexity and cost of the DAC.

The performance of a DAC is generally measured in terms of its resolution (number of increments), absolute accuracy (accuracy of actual analog output voltage with respect to ideal output voltage), speed of operation and cost.

It is herein recognized that a high resolution and low cost DAC may be constructed if other performance characteristics such as its absolute accuracy is relaxed. More specifically, the accuracy may be relaxed to the point where the output voltage performance is deliberately made non-monotonic. A DAC in accordance with the present invention generates a first incrementally variable duty factor signal in response to a group of the most significant bits of a digital word and a second incrementally variable duty factor signal in response to a group of the next most significant bits of the digital word. The amplitude of the first and second signals are differentially weighted such that the maximum average DC potential of the second signal is greater than the value of a single increment of the first signal. The weighted signals are combined and filtered by a lowpass filter which derives the analog voltage. Due to this type of differential weighting, the tolerance required for the values of the resistors used for performing the weighting function is substantially eased, thus reducing the cost of the DAC. Since the total contribution of the second signal is greater than one incremental value of the first signal, the DAC is non-monotonic. However, the full range of analog voltages can still be derived and with high resolution. Laser trimming of resistive components or precision switching circuitry is not required, further reducing the cost of the DAC. One such application for a DAC of this type is in a TV tuning system described herein.

In the drawings:

FIG. 3 illustrates, partially in block diagram form and partially in schematic diagram form, a tuning system for a television receiver incorporating the DAC of FIG. 1;

FIG. 4 illustrates in flow chart form one method for developing a duty factor signal representative of a digital word; and FIG. 5 illustrates, partially in block diagram form and partially in schematic diagram form an alternative embodiment of a DAC constructed in accordance with the invention.

Figure 1:
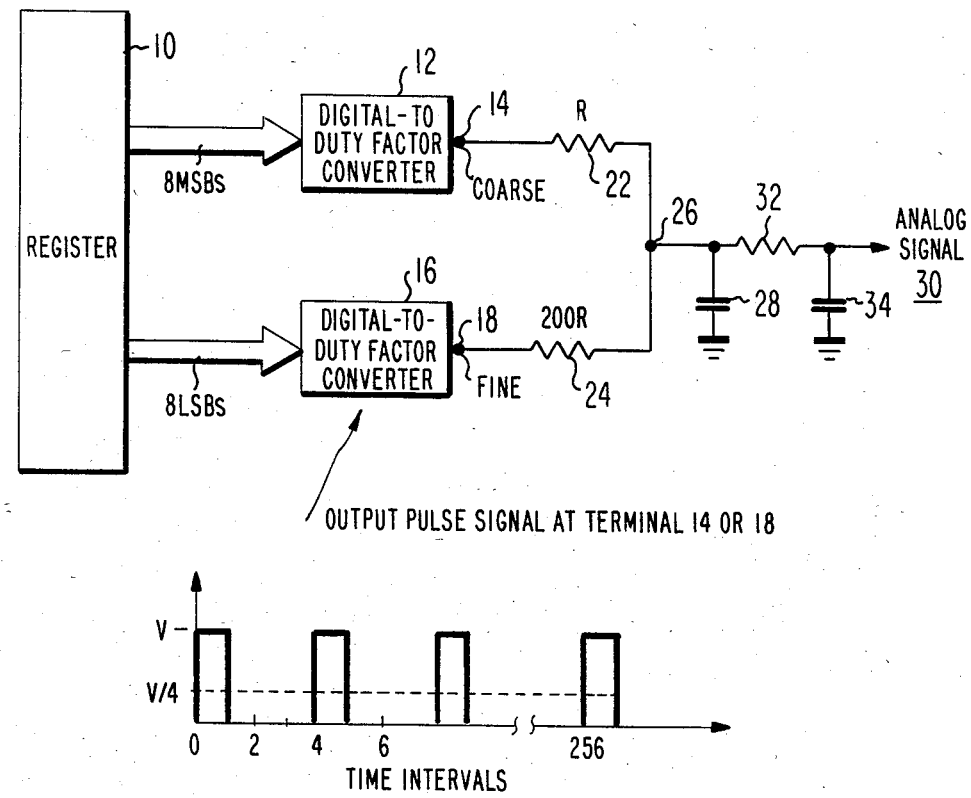
FIG. 1 illustrates partially in block diagram form and partially in schematic diagram form, a DAC constructed in accordance with the principles of the invention.

Referring to FIG. 1, a register 10 stores sixteen bits of a digital word to be converted to an analog value. The eight most significant bits (MSBs) of the 16-bit digital word are applied (as indicated by the broad arrow) to a digital-to-duty factor converter 12 for providing an output pulse signal (COARSE) at terminal 14. The COARSE signal has an average DC value representative of the value of the eight MSBs of the digital word.

Converter 12 may be constructed using a binary rate multiplier, which provides a plurality of uniformly short duration output pulses proportional in number in a given conversion period to the value of the eight MSBs. More specifically, converter 12 may be constructed by cascading in the "add" mode two 4-bit binary rate multiplier circuits, such as the CD4089 integrated circuit, manufactured by RCA Corporation, Solid State Division, Somerville, N.J., as shown in the 1978 RCA COS/MOS Integrated Circuits Data Book in FIG. 13 on page 246. In a similar manner, the eight least significant bits (LSBs), the remaining bits of the digital word stored in register 10, are applied (as indicated by the broad arrow) to a digital-to-duty factor converter 16, for providing an output pulse signal (FINE) at terminal 18 similar to the pulse signal provided at terminal 14 but, having a duty factor representative of the eight LSBs.

The illustrated output pulse signal waveform is typical of that provided by converter 12 or 16 when it is of the binary rate multiplier type and has 256 time intervals per conversion cycle for providing the pulse output signals with a duty factor incrementally variable in 256 increments from zero to 100%. The illustrated output pulse waveform has one pulse of amplitude V and duration one time interval every four time intervals and therefore, has an average DC value of V/4 volts which represents 25% of the maximum digital value. For example, if the COARSE and FINE output signals were as illustrated, they would represent 25% of the digital value representative of the 8 MSBs and 25% of the digital value representative of the 8 LSBs, respectively.

Typical prior art DACs include precision switching circuitry for multiplexing the COARSE and FINE signals together in order that the maximum incremental contribution of the FINE signal is precisely one FINE increment less than a single incremental contribution of the COARSE signal. In this manner a uniformly monotonic output is achieved. If the contribution of a single increment of the COARSE signal was greater that that indicated above, the output function would remain monotonic, but not uniform, and a group of output levels would be skipped (i.e, not derivable).

In accordance with the principles of the present invention, the COARSE and FINE signals are combined in a manner so as to deliberately produce a non-monotonic output. Consequently, the combining may be accomplished using lower cost standard tolerance resistors (e.g., 10%) and without the possibility of having a non-uniform monotonic output wherein output levels are skipped.

More specifically, a lowpass filter 20 includes a standard tolerance resistor 22 coupled to terminal 14 and a standard tolerance resistor 24 coupled to terminal 18 for combining the pulse output signals from converters 12 and 16 at a junction 26. The voltage divider action provided by resistors 22 and 24 differentially attenuate or weight the COARSE and FINE signals such that at junction 26, the maximum average DC value of the FINE signal is greater than the average DC value of a single increment of the COARSE signal. A capacitor 28 coupled between junction 26 and ground smooths the weighted and combined signal for developing the analog signal. An additional filter section 30 including a resistor 32 and a capacitor 34 provides further smoothing of the analog signal.

If uniform monotonicity were desired a differential weighting of 256:1 would be required to be provided by resistors 22 and 24. This can be mathematically expressed as:

$$R_f = 256 R_c$$

where $R_f$ equals the actual resistance value of resistor 24 and $R_c$ equals the actual resistance value of resistor 22. The tolerance required for assuring uniform monotonicity is 1 part in $2^{16}$ (65,536) or 0.0015%.

The relationship of the resistance values of resistors 22 and 24 for attenuating the COARSE and FINE signals so as to produce a non-monotonic output in accordance with the invention can be mathematically expressed as:

$$R_f < 256 R_c$$

When taking the tolerance of the resistors into account the above inequality can be expressed as:

$$R_f(1 \pm tol.) < 256 R_c (1 \pm tol.)$$

If it were decided to use, for example, 10% tolerance resistors, the effect of the worst case values would be:

$$R_f(1 + .1) < 256 R_c(1 - .1)$$

$$\frac{R_f}{R_c} < \frac{209}{1}$$

Therefore, using 10% tolerance resistors having a nominal resistance value ratio of 200:1 for resistors 24 and 22, respectively would be more than sufficient to guarantee a non-monotonic output (i.e, one where all output levels are derivable). For example, resister 22 can have a nominal value of 1 kilohm and resistor 24 can have a nominal value of 200 kilohms. As the nominal resistor value ratio is increased from 200:1 to 256:1, the amount of non-monotonicity is decreased and the tolerance required of resistors 22 and 24 is correspondingly tightened. Conversely, as the ratio is decreased from 200:1, correspondingly greater tolerance resistors can be used since the amount of non-monotonicity is increased.

Figure 2:
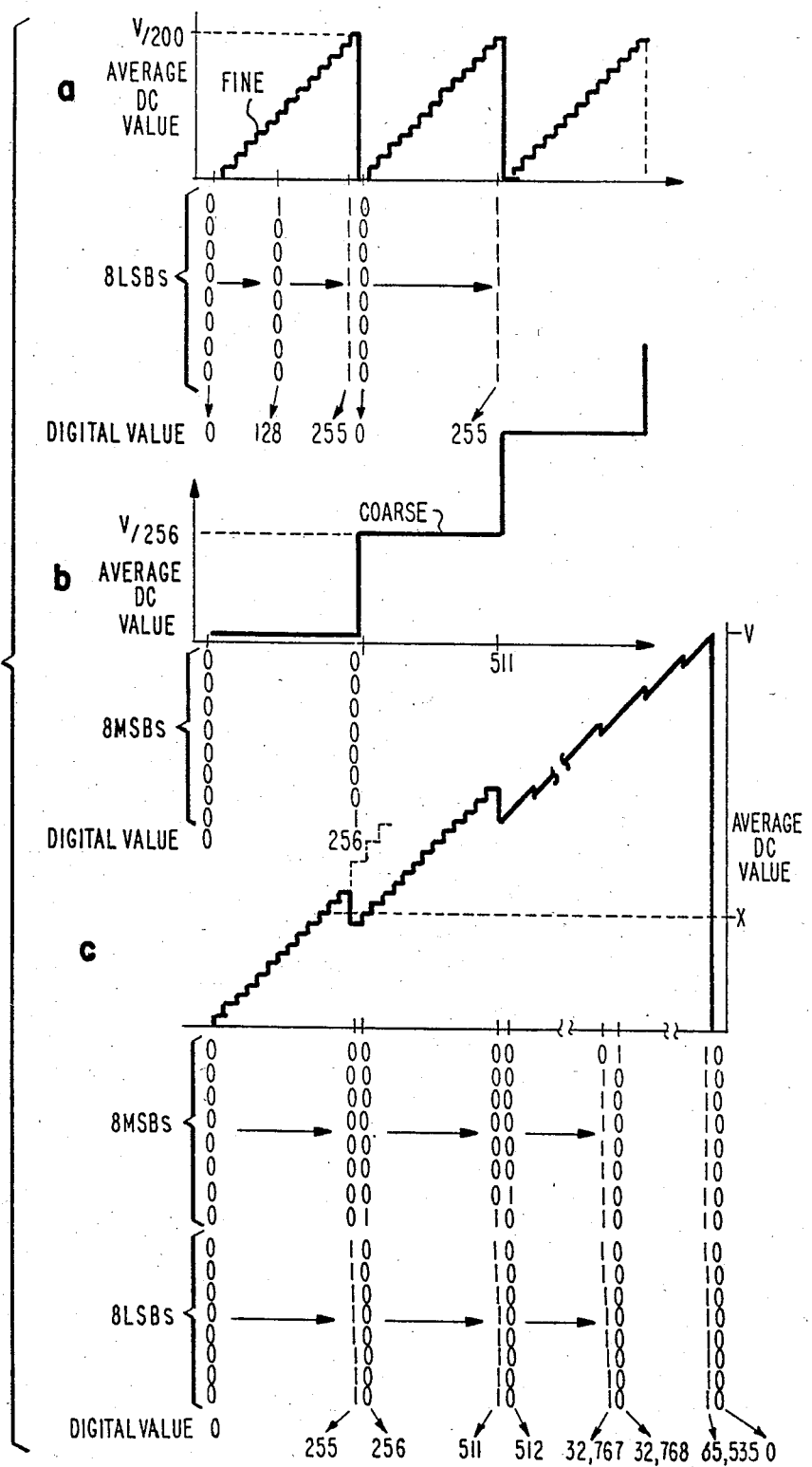
FIG. 2 illustrates waveforms useful for understanding the operation of the DAC of FIG. 1.

The waveforms of FIG. 2 illustrate the weighting and combining of the COARSE and FINE signals in accordance with the principles of the invention. Waveform "a" illustrates the 256 incremental average DC values of the FINE signal which would appear at junction 26 if the COARSE signal was not present. Each illustrated vertical increment is representative of approximately twenty actual increments of the digital value. The digital value is indicated along the horizontal axis. Since the FINE signal is generated in response to the 8 LSBs of the digital word, a repreating staircase having 255 increments of average DC value is illustrated in waveform "a". The maximum average DC value after 255 increments would be V/200 if 200:1 weighting were providing by resistors 22 and 24.

Waveform "b" illustrates several increments of the COARSE signal which would appear at junction 26 if the FINE signal was not present. Since the COARSE signal is generated in response to the 8 MSBs of the digital word, the digital value corresponding to a single increment of the COARSE signal is equal to 256 increments of the FINE signal. This is clearly indicated by the occurrence of one amplitude increment of waveform "b" after 255 amplitude increments of waveform "a". The average DC value of each increment of the COARSE signal is V/256. However, as previously noted, the maximum average DC value of the FINE signal is V/200. Thus, when waveforms "a" and "b" are combined, as illustrated in waveform "c", it is evident that the maximum average DC value after 255 increments of the FINE signal is not one FINE increment less than one increment of the COARSE signal, as would be the case for a uniformly monotonic DAC, but it is greater than the average DC value of a single increment of the COARSE signal by a fixed amount. In the illustrative embodiment this amount corresponds to 1/200−1/256 or about 22%. Consequently, the combined signal is not monotonic but includes a non-monotonic portion each group of 256 increments of the digital value, as shown in waveform "c".

The first 512 increments of the combined signal shown in waveform "c" are shown in an expanded form and the remaining increments, 512-65,535, are shown in a condensed form for simplicity. The maximum digital value of the 16-bit digital word is $2^{16}$ or 65,535, which corresponds to the maximum average DC value obtainable, i.e., V.

Thus, there are 65,535 resolution elements for precisely deriving an analog signal. However, due to the non-monotonicity of the conversion, there are two digital values which may be used to represent some of the analog values within a portion of each group of 256 increments surrounding the non-monotonic portions of the waveform. For example, an average DC value of X could be represented by a digital value of 255 less two illustrated steps (approximately 40) i.e., 215 and 255 plus one illustrated step (approximately 20) i.e., 275.

Although in a DAC in accordance with the invention multiple digital values define some of the analog output, each analog output between zero and V is derivable and with a high resolution, on the order of one part in $2^{16}$ (65,535) less an overlap amount due to the non-monotonicity, as explained in the above example, corresponding to approximately 56/256 or 22%. This results in an overall resolution of one part in 51,176 which is still substantially greater than a 14-bit resolution of one part in 16,384 generally required for TV tuning systems.

An example of the output of a non-uniform monotonic DAC (mentioned earlier) is illustrated on waveform "c" in dashed lines for digital values near 256. Note that although the digital value changes only one increment from digital value 255 to 256, the average DC value changes about 60 increments, thus skipping 60 of 256 or about 24% of the possible output levels. A non-monotonic DAC in accordance with the principles of the invention does not skip any output levels.

In the television receiver of FIG. 3 a microcomputer 300 controls the tuning of the receiver to a selected channel by internally generating a 16-bit digital word and supplying COARSE and FINE pulse output signals representative of the eight MSBs and eight LSBs of the digital word at outputs 310 and 312, respectively. The pulse output signals at terminals 310 and 312 are differentially weighted and combined by standard tolerance resistors 316 and 318, respectively, of a lowpass filter 314 for generating an analog signal across a capacitor 319 in a manner similar to that described above with respect to FIG. 1. The analog signal is further smoothed by an additional lowpass filter 320 including a resistor 322 and capacitor 324 and applied as a tuning voltage to the local oscillator portion of a tuner 326.

A source of operating voltage (V) is coupled to the cathode of a 30 volt Zener diode 330 for developing a reference voltage which exceeds the maximum tuning voltage required. A resistor 332 couples 30 volts from the cathode of Zener diode 330 to the output stage of microcomputer 300 via terminal 310. This results in a COARSE signal at terminal 310 similar to the COARSE signal shown in FIG. 2, but having a pulse amplitude of 30 volts. A 5 volt Zener diode 334 receives voltage from diode 330 via a resistor 336 and provides a 5 volt operating potential for microcomputer 300. To reduce the voltage handling requirements of the semiconductor elements within microcomputer 300, the output stage for terminal 312 uses the 5 volt operating potential and the pulses of the FINE signal have a 5 volt amplitude. The manner in which microcomputer 300 generates the COARSE and FINE signals will be described in greater detail later on with respect to FIG. 4.

Since the amplitude of the pulses of the FINE signal is one sixth the amplitude of the pulses of the COARSE signal, the weighting required by the resistors of filter 314 can be accomplished with a ratio of 1/6 of the 200:1 ratio described with respect to FIG. 1, i.e., 33:1. Thus, resistor 316 may have a nominal resistance value of 1 k ohm and resistor 318 may have a nominal resistance value of 33 k ohm (when 10% tolerance resistors are used).

In operation, a receiving antenna 338 couples received radio frequency (RF) signals to tuner 326 where they are heterodyned with the local oscillator (LO) signal generated by a local oscillator stage, for generating an IF (intermediate frequency) signal with a picture carrier having a nominal frequency, e.g., 45.75 MHz in the NTSC television system. The IF signal is amplified by an IF stage 340 and applied to the remainder of the TV receiver 342 for reproduction of the picture and sound portions corresponding to the selected channel.

For controlling the tuning of the TV receiver, a channel selector 344, which may be either a keyboard entry device or a remote control transmitter, is operated by the user to provide a signal to microcomputer 300 which is representative of the desired channel to be received. In response to the channel selection signal, microcomputer 300 stores a signal in a register 346 which is representative of the actual LO signal required for correctly tuning the RF signal corresponding to the selected channel. Microcomputer 300 includes a second register portion 348 responsive to the tuner local oscillator signal, after being divided by a frequency divider 349 for reducing its frequency to one more easily handled by microcomputer 300, for storing a signal representative of the actual frequency of the LO signal. A comparator 350 compares the signal stored in register 346 with the signal stored in register 348 to determine if the LO signal frequency and hence the analog tuning voltage is too low or too high. If the value of the signal stored in register 348 is greater (lesser) than the value stored in register 346, the LO signal frequency is too high (low).

For tuning the LO signal to the correct frequency, a control portion 352 of microcomputer 300 issues commands which increment or decrement the value of a 16-bit digital word stored in a register 354. The digital word stored in register 354 is used to form the COARSE and FINE pulse signals provided at terminals 310 and 312. The digital value of the stored word is changed (using a successive approximation technique to be described in greater detail later on) until comparator 350 indicates that the actual LO signal frequency matches that frequency required for correct channel selection (i.e., it looks for a comparison of each bit stored in registers 346 and 348).

Thereafter, the acquisition mode of the tuning is complete and microcomputer 300 enters an automatic frequency control (AFC) mode wherein it is responsive to the frequency of the picture carrier of the IF signal appropriately divided by a fixed signal frequency divider 351, for storing a value representative of the actual IF signal frequency and comparing it with a stored value representative of the nominal frequency of the picture carrier (i.e., 45.75 MHZ). In a manner similar to that described above for the acquisition mode, the digital word stored in register 354 is incremented or decremented so as to generate a tuning voltage which maintains the actual IF picture carrier frequency at the nominal frequency.

A description of the commands or algorithm processed by the control portion 352 of microcomputer 300 for providing and tuning the COARSE and FINE pulse signals at terminals 310 and 312, respectively, is illustrated by the flow chart of FIG. 4 and will next be described. It should be understood, however, that hardware such as shown and described with respect to FIG. 1 along with some additional comparator and register circuitry could easily be arranged by one of ordinary skill in the art to be used in place of microcomputer 300.

For providing the COARSE and FINE pulse signals (representative of the eight MSBs and eight LSBs respectively, of the digital word stored in register 354) microcomputer 300 sets up a time interval having 256 increments. Once each increment of the time interval, controller 352 adds the eight MSBs to an accumulator. If a ninth bit (a carry bit) results from the addition, the output at terminal 310 is held high, but, if a carry bit is not generated, the output at terminal 310 is held low. After the FIG. 4 process is repeated 256 consecutive times, the output signal developed at terminal 310 will have a duty factor (and hence an average DC value) which is representative of the digital value of the eight MSBs. [Consider, for example, the binary number 01 which corresponds to 25% of the maximum digital value able to be represented by two bits. By successively adding 01 to any two bit number, a carry would be generated 25% of the time.] A duty factor signal at terminal 312 is generated in response to the eight LSBs of the stored digital value in the same manner as the eight MSBs.

As previously noted, the bits of the digital word stored in register 354 are determined by a successive approximation technique. Controller 352 initially sets the most significant bit of the digital word stored in register 354 to a 1 and the rest of the bits are set to zero. This corresponds to a digital value which is 50% of the maximum possible digital value. If comparator 350 indicates the LO signal frequency and hence the tuning voltage is too high (i.e., greater than that required for tuning the selected channel) the digital value stored in register 354 is decreased by 50%. This is accomplished by changing the most significant bit to a zero and the next most significant bit to a 1 (the remaining bits are still zero). Conversely, if the tuning voltage is too low, the digital value is increased by 50% by leaving the most significant bit at 1 and changing the next most significant bit from a zero to a 1. By repeating this process sixteen times in succession, the digital word stored in register 354 is caused to be preceisely that value which generates a tuning voltage for correctly tuning the selected channel.

Thus, a feedback loop 360 comprising microcomputer 300, lowpass filters 314 and 320, tuner 326 and signal frequency divider 349 precisely determines the analog tuning voltage. Although the transfer function of the DAC is non-monotonic, as shown by wavefore "c" of FIG. 2, any analog tuning voltage from zero volts to V volts can be generated and, as previously noted, with a resolution of approximately 1 part in 50,000 which is substantially greater than that generally required for TV tuning systems.

Although the DAC of FIG. 1 processes the digital word stored in register 10 in two groups of equal numbered bits, other grouping arrangements are possible. For example, COARSE, MEDIUM and FINE pulse signals can be generated as shown in FIG. 5. A register 510 stores an 18-bit digital word. Digital-to-duty factor converters 512–516 are responsive to successive groups of 6-bits each of the digital word, beginning with the most significant bit, for generating COARSE, MEDIUM and FINE pulse signals at their outputs in a manner similar to the generation of the COARSE and FINE pulse signals previously described (i.e., in FIG. 1 or FIG. 3). Standard tolerance resistors 518–522 are coupled to the output of converters 512–516 for combining the pulse signals in accordance with the principles of the invention, such that the maximum average DC value of each of the pulse signals representative of a lower order group of bits, is greater than a single incremental value of a pulse signal representative of the group of next most significant bits.

Furthermore, although it is not necessary to divide the bits of the digital word into equal numbers of bits, to do so is desirable since it minimizes the operation frequency required by the pulse converters. Additionally, although the inventive DAC is illustrated in the feedback loop of a TV tuning system, it may also find use in many other applications. For example, the converter illustrated in FIG. 1 could be used in place of microcomputer 300 in the tuning systems of FIG. 3. In this case, the viewer would increment the value of the digital word stored in register 10 until the tuning voltage generated is such that a desired TV channel is received. These and other modifications are considered to be within the scope of the following claims.

What is claimed is:

1. Apparatus for converting a digital word including a plurality of bits to an analog signal comprising:
   means for converting a first group of the most significant bits of said digital word to a first pulse signal having an incrementally variable duty factor;
   means for converting a second group of the next most significant bits of said digital word to a second pulse signal having an incrementally variable duty factor; and
   analog combining means for differently weighting and then combining said first and second pulse signals and lowpass filtering the resultant signal to produce an analog signal which, in response to consecutive increments of the value of said digital word, has periodic non-monotonic increments.

2. The apparatus of claim 1 wherein said combining means includes a first resistor coupled to receive said first pulse signal and a second resistor coupled to receive said second pulse signal.

3. The apparatus of claim 2 wherein said non-monotonic portions result in a given percentage of the incremental level of said analog signal being repeated and said first and second resistors have an actual resistance value tolerance from a nominal resistance value of substantially one-half said given percentage.

4. Apparatus for converting a digital word including a plurality of bits to an analog value comprising:
   means for converting a first group of the most significant bits of said digital word to a first pulse signal having an incrementally variable duty factor;
   means for converting a second group of the next most significant bits of said digital word to a second pulse signal having an incrementally variable duty factor; and
   analog combining means comprising a first resistance means for receiving said first pulse signal and a second resistance means for receiving said second pulse signal for differently attenuating and then combining said first and second pulse signals such that the average DC value of said second pulse signal at its maximum incremental duty factor ' is greater than the value of a single increment of the average DC value of said first pulse signal, said analog combining means providing said analog value at its output.

5. The apparatus of claim 4 wherein said combining means includes a capacitor coupled to said first and second resistor resistance means for filtering said first and said second pulse signals so as to provide said analog value at its output.

6. The apparatus of claim 4 wherein said first and second groups include 8-bits each.

7. The apparatus of claim 6 wherein said first and second resistance means comprise first and second resistors, respectively, the resistance values of said resistors having a tolerance in a range decreasing from approximately 10% as the ratio of the nominal resistance values of said resistors are increased in a range between approximately 1:200 towards 1:256.

8. The apparatus of claim 4 wherein said digital word comprises 18-bits and said first and second groups include 6-bits each.

9. Apparatus for converting a digital word including a plurality of bits to an analog signal comprising:
means for converting a first group of the most significant bits of said digital word to a first pulse signal having an incrementally variable duty factor;
means for converting a second group of the next most significant bits of said digital word to a second pulse signal having an incrementally variable duty factor; and
analog signal combining means, comprising a first resistor having one end coupled to receive said first pulse signal, a second resistor having one end coupled to receive said second pulse signal, and a capacitor coupled to the other end of said first and second resistors for developing said analog signal, wherein the ratio of the nominal resistance value of said first resistor to the nominal resistance value of said second resistor differently attenuates said first and second pulse signals so that the maximum average DC value of said second pulse signal is greater than the average DC value of a single increment of said first pulse signal by a predetermined percentage.

10. The apparatus of claim 9 wherein said first and second resistors have an actual resistance value within a given tolerance of said nominal values, the percentage of said given tolerance being approximately equal to one-half said predetermined percentage.

11. In a television tuning system including an oscillator responsive to a tuning voltage for generating a local oscillator signal, channel selector means for providing signals representative of a selected channel and means responsive to said signals provided by said channel selector for generating a multibit digital word, apparatus for providing said tuning voltage comprising:
means for converting a first group of the most significant bits of said digital word to a first pulse signal having an incrementally variable duty factor;
means for converting a second group of the next most significant bits of said digital word to a second pulse signal having an incrementally variable duty factor; and
analog combining means comprising a first resistance means for receiving said first pulse signal and a second resistance means for receiving said second pulse signal for differently weighting and then combining said first and second pulse signals such that the average DC value of said second pulse signal at its maximum incremental duty factor is greater than the value of a single increment of the average DC value of said first pulse signal, said analog combining means developing said tuning voltage at its output.

12. The apparatus of claim 11 wherein said means for generating said digital word comprises:
means for comparing the frequency of said local oscillator signal to said signal provided by said channel selector means; and
control means responsive to said comparing means for generating said digital word.

13. The apparatus of claim 12 wherein said oscillator, said comparing means, said control means and said apparatus for providing said tuning voltage form a feedback loop.

14. Apparatus comprising:
utilization means having a control input responsive to an analog signal for controlling an operating function of said utilization means, said utilization means providing an indicating signal for indicating the condition of said operating function;
means for providing said analog signal in response to an applied digital word, comprising
means for converting a first group of the most significant bits of said digital word to a first pulse signal having an incrementally variable duty factor;
means for converting a second group of the next most significant bits of said digital word to a second pulse signal having an incrementally variable duty factor;
analog combining means comprising a first resistance means for receiving said first pulse signal and a second resistance means for receiving said second pulse signal for differently attenuating and then combining said first and second pulse signals such that the average DC value of said second pulse signal at its maximum incremental duty factor is greater than the value of a single increment of the average DC value of said first pulse signal, said analog combining means providing said analog value at its output; and
sensing means coupled to be responsive to said indicating signal for controlling the values of said digital word applied to said providing means.

15. The apparatus of claim 14 wherein said analog combining means comprises:
a first resistor coupled at one end to receive said first pulse signal, a second resistor coupled at one end to receive said second pulse signal and a low pass filter coupled to a junction formed by the second ends of said first and second resistors, respectively.

* * * * *